United States Patent
Takayama et al.

(10) Patent No.: US 7,667,174 B2
(45) Date of Patent: Feb. 23, 2010

(54) SOLID STATE IMAGING DEVICE IN WHICH EACH PHOTOELECTRIC TRANSDUCER OF PLURAL UNIT PIXELS BEING LOCATED AXISYMMETRICALLY WITH A SYMMETRICAL AXIS OF A CENTERLINE PASSING THROUGH AN APPROXIMATE CENTER OF THE DEVICE

(75) Inventors: Jun Takayama, Tama (JP); Masashi Saito, Koganei (JP)

(73) Assignee: Konica Minolta Holdings, Inc., Tokyo (JP)

( * ) Notice: Subject to any disclaimer, the term of this patent is extended or adjusted under 35 U.S.C. 154(b) by 478 days.

(21) Appl. No.: 11/665,031

(22) PCT Filed: Oct. 4, 2005

(86) PCT No.: PCT/JP2005/018372

§ 371 (c)(1),
(2), (4) Date: Apr. 10, 2007

(87) PCT Pub. No.: WO2006/040963

PCT Pub. Date: Apr. 20, 2006

(65) Prior Publication Data
US 2009/0027541 A1   Jan. 29, 2009

(30) Foreign Application Priority Data
Oct. 15, 2004   (JP) .............................. 2004-301116

(51) Int. Cl.
*H01L 27/00* (2006.01)

(52) U.S. Cl. ..................................... 250/208.1; 250/239
(58) Field of Classification Search .............. 250/208.1, 250/239, 216, 226; 257/290–292, 440
See application file for complete search history.

(56) References Cited

U.S. PATENT DOCUMENTS 7,531,782 B2 *   5/2009   Sakoh et al. ............. 250/208.1

FOREIGN PATENT DOCUMENTS

| JP | 01-213079 A | 8/1989 |
| JP | 6-140609 A | 5/1994 |
| JP | 2000-198505 A | 7/2000 |
| JP | 2004-134790 A | 4/2004 |

* cited by examiner

*Primary Examiner*—Que T Le
(74) *Attorney, Agent, or Firm*—Frishauf, Holtz, Goodman & Chick, P.C.

(57) ABSTRACT

A solid-state imaging device provided with a light receiving surface, in which plural unit pixels, each having a photoelectric transducer to convert light signals into electric signals, are two-dimensionally arranged; a microlens to focus a light beam, the microlens being arranged in each unit pixel corresponding to the photoelectric transducer; an aperture section, to allow the light beam to enter the photoelectric transducer, the aperture section being arranged in each unit pixel corresponding to the photoelectric transducer; a wiring layer, which comprises plural layers, and is formed between the photoelectric transducer and the microlens, wherein the plural unit pixels are arranged such that each of the photoelectric transducer is located axisymmetrically with a symmetrical axis of a first centerline passing through an approximate center of the light receiving surface.

14 Claims, 10 Drawing Sheets

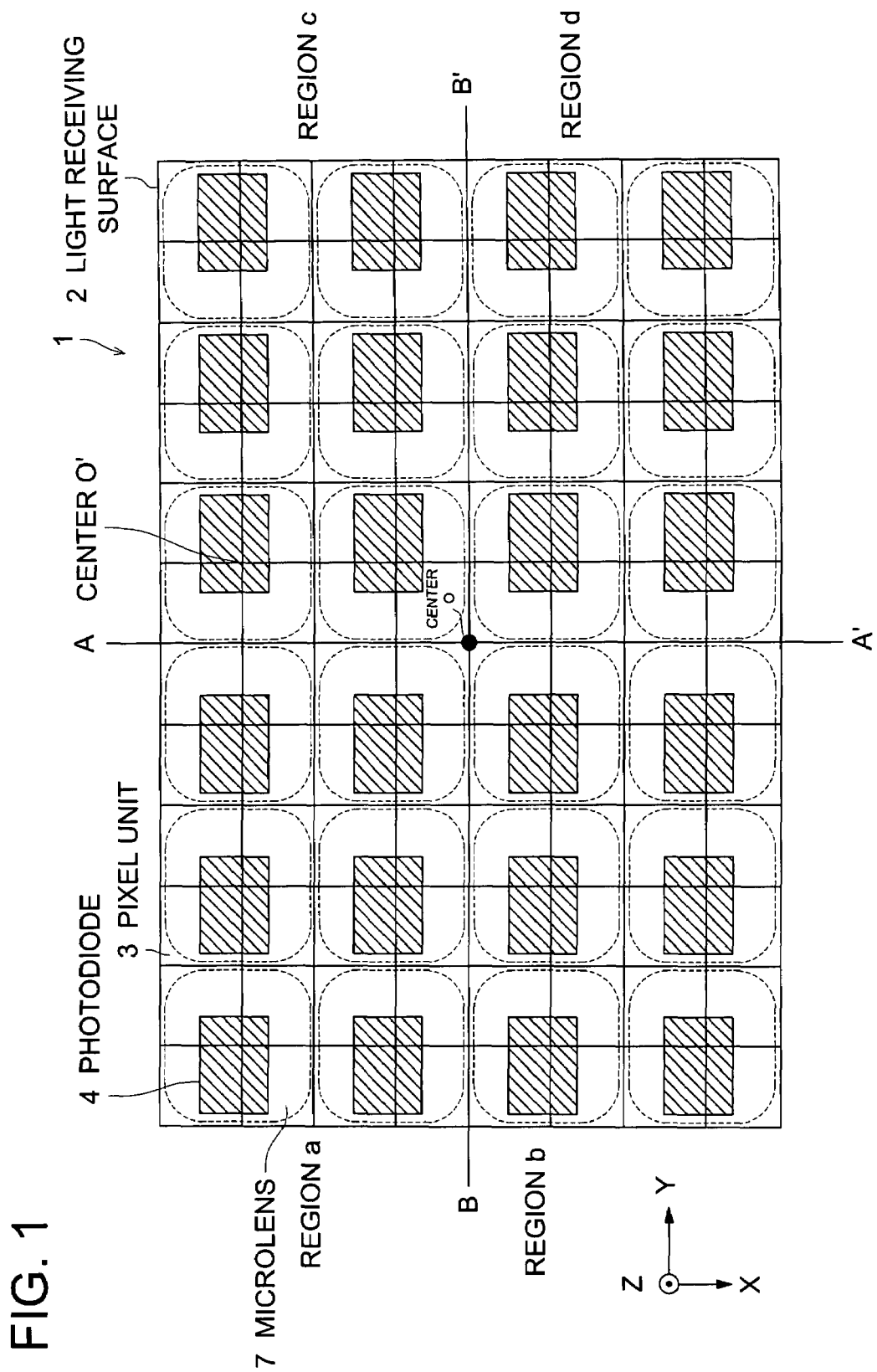

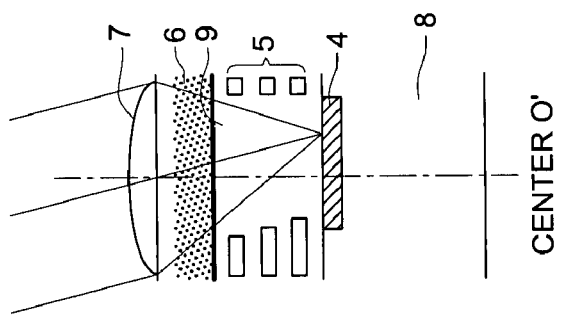
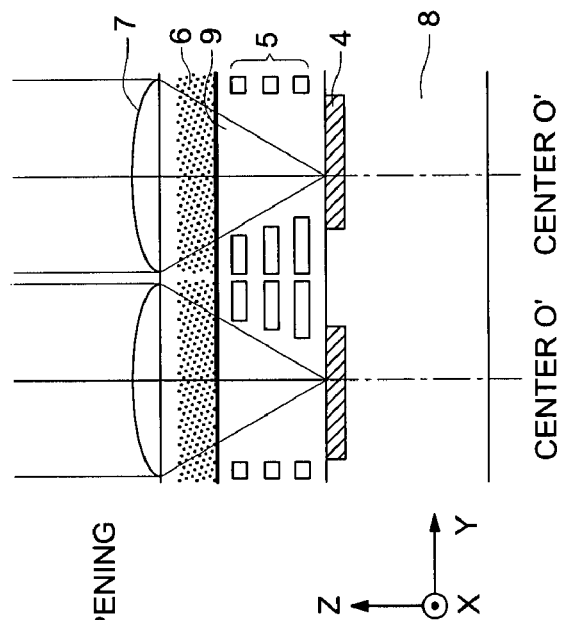
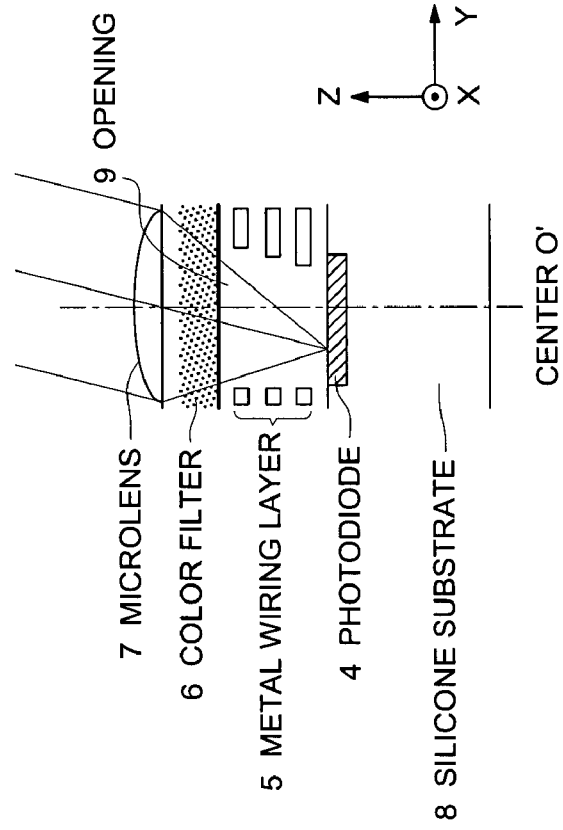

FIG. 8 (a)
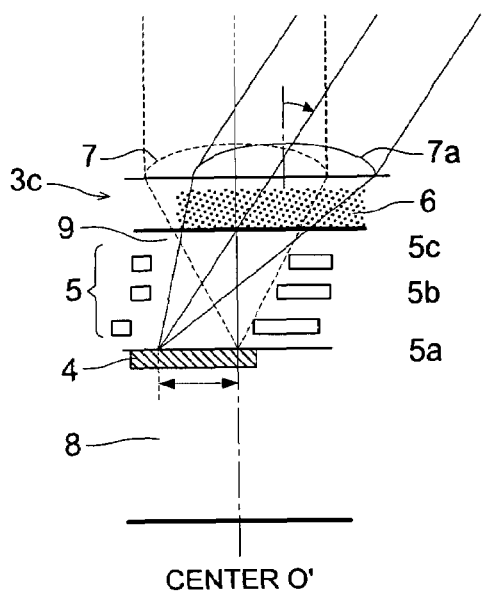
FIG. 8 (b)
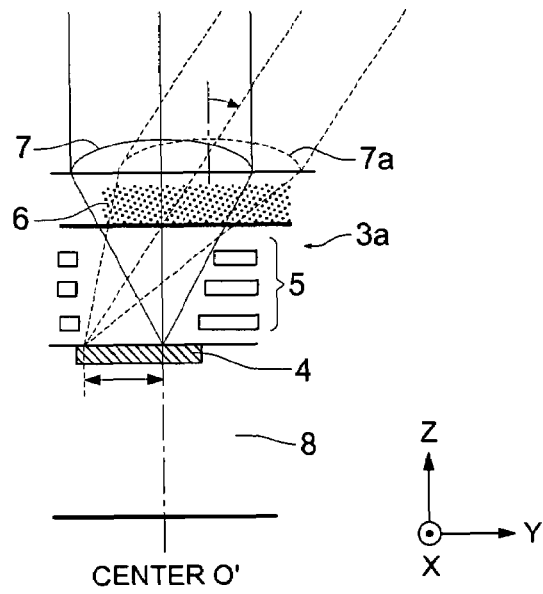
FIG. 9 (a)    FIG. 9 (b)    FIG. 9 (c)
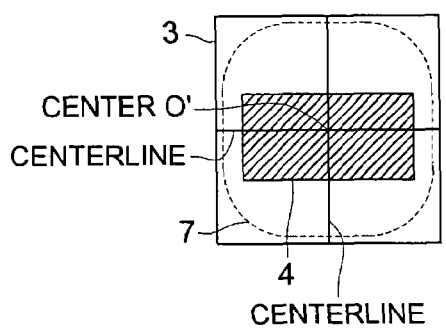 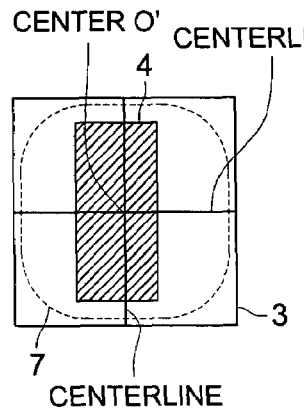 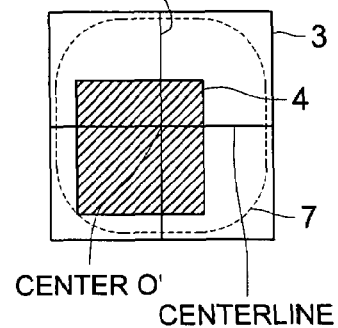

US 7,667,174 B2

SOLID STATE IMAGING DEVICE IN WHICH EACH PHOTOELECTRIC TRANSDUCER OF PLURAL UNIT PIXELS BEING LOCATED AXISYMMETRICALLY WITH A SYMMETRICAL AXIS OF A CENTERLINE PASSING THROUGH AN APPROXIMATE CENTER OF THE DEVICE

This application is a U.S. National Phase Application under 35 USC 371 of International Application PCT/JP2005/018372 filed Oct. 4, 2005.

BACKGROUND OF THE INVENTION

1. Technical Field

This invention relates to a solid-state imaging device, and specifically to a solid-state imaging device capable of correcting shading, which is caused by angled incident light.

2. Description of Related Art

Nowadays, in such as video cameras and electronic cameras, solid state imaging devices such as CCD image sensors, CMOS image sensors, and amplification type image sensors are widely utilized. Generally, a light receiving section is provided in each pixel of the solid state imaging device with prescribed pitch in length and width, and provided on the periphery of the light receiving section of each pixel is a charge transfer area, in the case of a CCD image sensor, or provided is a wiring area including such as a charge detection amplifier and a gate for signal transfer, in the case of a CMOS image sensor.

FIGS. 10(a) and 10(b) schematically illustrate a structure of a unit pixel in a solid-state imaging device. FIG. 10(a) is a plan view schematically showing unit pixel 3 in the solid-state imaging device, and illustrates a position of photodiode 4 (light receiving section) as a photoelectric transducer in unit pixel 3. Photodiode 4 usually occupies 20-30% of the area of each unit pixel, and the larger the area becomes the higher the sensitivity of the photodiode. In FIG. 10(a), only photodiode 4 and microlens 7 are illustrated, however in actual, such parts as a transistor to read-in signals and a metal wiring are formed in the vicinity of photodiode 4.

FIG. 10(b) is a sectional view of unit pixel 3. As shown in FIG. 10(b), photodiode 4, serving as a photo electric transducer, is embedded in silicone substrate 8, further, above the photodiode, provided are metal wiring layers 5, color filter 6, and microlens 7. In this way, photodiode 4 as the photoelectric transducer, is formed, when viewed from above, under microlens 7, color filter 6, and metal wiring layer 5.

As shown in FIGS. 10(a), 10(b), since it is necessary to arrange a transistor and a wiring, etc., in each unit pixel 3, photodiode 4 is not usually formed at the center of unit pixel 3 (center of photodiode 4 does not coincide with center O' of unit pixel 3). For example, as shown in FIG. 10(a), photodiode 4 is formed at the area shifted from center O' of unit pixel 3 in the Y-direction (toward the left side in the figure), and further slightly shifted in the X-direction (downward in the figure), and the transistor and the wiring, etc. are arranged in the other areas.

The solid-state imaging device is structured two-dimensionally by arranging plural unit pixels 3 having this type of structure. In conventional solid-state imaging devices, unit pixels, each having the same structure, are arranged. For example, as shown in FIG. 11, conventional solid state imaging apparatus 10 is structured by arranging unit pixel 3 shown in FIG. 10(a). Therefore, in every unit pixel 3, photodiode 4 is formed at a position shifted in the same direction from center O' of unit pixel 3. In this conventional case, in every unit pixel 3, photodiode 4 is formed by shifting to left side and further, slightly downward.

In the solid state imaging apparatus having this type of structure, incident light from Z-direction (vertical to the surface of the drawing) enters approximately vertically in the vicinity of center O of the light receiving surface, while in the unit pixel arranged nearer to the periphery of light receiving surface apart from center O, the incident light enters with larger angle. Here, light receiving surface 2 means the surface where incident light enters in the solid-state imaging device, and a whole surface of all unit pixels 3 parallel to the surfaces of the photoelectric transducers is assumed to be light receiving surface 2.

The difference of this incident angle will be described by referring to the sectional view of the unit pixel shown in FIG. 12, which shows the sectional view taken along line B-B' of FIG. 11. In unit pixel 3, arranged near the center O, the incident light enters approximately vertically to unit pixel 3 as shown by solid lines in FIG. 12. On the other hand, in unit pixel 3 arranged left of line A-A' of FIG. 11, on the periphery area of light receiving surface 2, the incident light enters at an angle slanted from right to left (from center O of light receiving surface 2 to the periphery) as shown by broken lines in FIG. 12. While, in unit pixel 3 arranged right of line A-A' of FIG. 11 at the periphery of light receiving surface 2, the incident light enters at an angle slanted from left to right (from center O of light receiving surface 2 to the periphery) as shown by dashed-dotted lines in FIG. 12.

As shown in FIGS. 10(b) and 12, in each unit pixel 3, photodiode 4, which actually perform photoelectric conversion, is not formed at a top surface but is formed below microlens 7, color filter 6, and metal wiring layer 5. Due to this, though there is no problem in cases where the incident light enters vertically to light receiving surface 2, in cases where the incident light enters with an angle, the incident light may be reflected or blocked, by metal wiring layer 5 for example, and the light amount arriving to photodiode 4 may be decreased.

In the pixel structure shown in FIGS. 10(b) and 12, decreased is the receiving light amount by unit pixel 3 arranged at the right of line A-A' near the periphery of light receiving surface 2. This is because the focusing position of the incident light entering aslant from the left (the light beams indicated by dashed-dotted lines) is deflected out of photodiode 4, and the incident light is reflected or blocked by metal wiring layer 5. While, in unit pixel 3 arranged left of line A-A' on the periphery area of light receiving surface 2, as shown in FIG. 12, the light beam enters aslant from the right side (the light beams indicated by broken lines), however, since photodiode 4 is formed left in unit pixel 3, the incident light is able to arrives photodiode 4.

Further, in top/bottom direction in FIG. 11, similarly to in the right/left direction, exposure light amount to photodiode 4, in unit pixel 3 arranged at the periphery area of light receiving surface 2 decreases, due to the incident light with an angle.

In this way, since the amount of received light at the periphery area of light receiving surface 2 is decreased compared to that near center O, images at the periphery area become darker and uneven sensitivity (so-called brightness shading) is generated.

FIG. 13(a) shows a graph of the amount of received light in a case where shading is generated. The horizontal axis shows the lateral position of light receiving surface 2, and the vertical axis shows the output value (the amount of received light). In these graphs, the broken line curve indicates the ideal output, and the solid line curve shows the output in the case where the solid-state imaging device relating to the conventional art receives incident light. As shown in this graph, the amount of received light near center O of light receiving surface 2 is large and nearly same as the ideal output. However, nearer the periphery, the amount of received light gradually decreases and goes away from the ideal output value. Thus, in the peripheral area, the amount of received light decreases to darkness. Here, in FIG. 13(a), the amount of received light in the lateral direction is shown, while the amounts of received light at the peripheral area in the top/bottom direction and in the aslant direction similarly decrease to darkness.

Further, the shape of the aperture for photodiode 4 is not necessarily symmetrical, as shown in FIG. 12, for example, there are differences in the amount of received light of photodiode 4 between cases of right slanted incident light and left slanted incident light, therefore, the amount of received light differs in right/left direction or in top/bottom direction on light receiving surface 2. For example in the pixel structure of FIG. 11, the amount of received light in Y-direction (namely the right/left direction) varies as shown by the graph in FIG. 13(b), such that the amount of received light of unit pixel 3 arranged right of center O becomes less than that of unit pixel 3 arranged left of center O. Further, since there are also cases where this difference varies according to the color of the received light, as shown by the graph in FIG. 13(c), slight uneven color (so-called color shading) may be generated in the right/left direction or top/bottom direction.

As a method for correcting such uneven sensitivity (brightness shading), the method in which the pitch of microlens 7 arranged in each unit pixel 3 is made smaller than the pitch of unit pixel 3, and along with going nearer to the periphery of light receiving surface 2, microlens 7 is shifted in the direction to the center of each unit pixel 3 (e.g. Patent Document 1).

Further, a correcting method is known in which a light reflecting section is provided on an inner wall of aperture 9 in unit pixel 3 to correct the uneven sensitivity (brightness shading) (e.g. Patent Document 2).

Patent Document 1: Unexamined Japanese Patent Application Publication No. H01-213079

Patent Document 2: Unexamined Japanese Patent Application Publication No. 2000-198505

According to the method of Patent Document 1, the uneven sensitivity (brightness shading) can be corrected to some extent, however, complete correction of uneven sensitivity (brightness shading) is not possible, and uneven color (color shading) cannot be corrected. Further, according to the method of Patent Document 2, complete correction of uneven sensitivity (brightness shading) is not possible, and similarly to the method of Patent document 1, uneven color (color shading) cannot be corrected.

An object of the present invention is to solve the above-mentioned problems, and to decrease the uneven sensitivity and uneven color by correcting the brightness shading and color shading of the solid-state imaging device.

SUMMARY OF THE INVENTION

An embodiment to achieve the above-described object is a solid-state imaging device provided with a light receiving surface, in which plural unit pixels, each having a photoelectric transducer to convert light signals into electric signals, are two-dimensionally arranged; a microlens to focus a light beam, the microlens being arranged in each unit pixel corresponding to the photoelectric transducer; an aperture section, to allow the light beam to enter the photoelectric transducer, the aperture section being arranged in each unit pixel corresponding to the photoelectric transducer; a wiring layer, which comprises plural layers, and is formed between the photoelectric transducer and the microlens, wherein the plural unit pixels are arranged such that each of the photoelectric transducer is located axisymmetrically with a symmetrical axis of a first centerline passing through an approximate center of the light receiving surface.

BRIEF DESCRIPTION OF THE DRAWINGS

FIG. 1 is a top view schematically showing the structure of the solid-state imaging device relating to the first embodiment of the present invention.

FIGS. 2(a)-(c) are sectional views schematically showing the structure of the unit pixels of the solid-state imaging device relating to the first embodiment of the present invention.

FIGS. 8(a)-(b) are sectional views of the unit pixels illustrating the operation of the solid-state imaging device relating to the third embodiment of the present invention.

FIGS. 9(a)-(c) are top views showing various configurations of the photoelectric transducer in the solid-state imaging device relating to the embodiment of the present invention.

DETAILED DESCRIPTION OF THE PREFERRED EMBODIMENTS

Figures 3A, 3B, 3C:
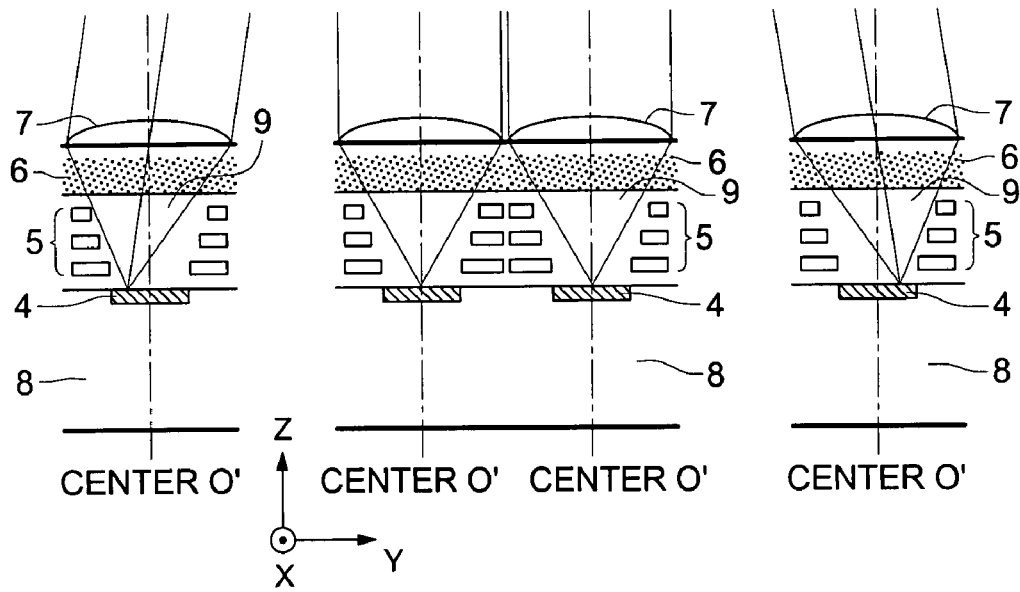
FIGS. 3(a)-(c) are sectional views schematically showing the structure of the unit pixels of the solid-state imaging device relating to the first embodiment of the present invention.

The above-mentioned object can be achieved by the following structures.

(1) A solid-state imaging device including: a light receiving surface, in which plural unit pixels, each having a photoelectric transducer to convert light signals into electric signals, are two-dimensionally arranged; a microlens to focus a light beam, the microlens being arranged in each unit pixel corresponding to the photoelectric transducer; an aperture section, to allow the light beam to enter the photoelectric transducer, the aperture section being arranged in each unit pixel corresponding to the photoelectric transducer; a wiring layer, which comprises plural layers, and is formed between the photoelectric transducer and the microlens, wherein the plural unit pixels are arranged such that each of the photoelectric transducer is located axisymmetrically with a symmetrical axis of a first centerline passing through an approximate center of the light receiving surface.

(2) The solid-state imaging device of (1), wherein the plural unit pixels are arranged such that each of the photoelectric transducer is located axisymmetrically with a symmetrical axis of a second centerline passing through an appropriate center of the light receiving surface, the second centerline being vertical to the first centerline.

(3) A solid-state imaging device including: a light receiving surface, in which plural unit pixels, each having a photoelectric transducer to convert light signals into electric signals, are two-dimensionally arranged; a microlens to focus a light beam, the microlens being arranged in each unit pixel corresponding to the photoelectric transducer; an aperture section, to allow the light beam to enter the photoelectric transducer, the aperture section being arranged in each unit pixel corresponding to the photoelectric transducer; a wiring layer, which comprises plural layers, and is formed between the photoelectric transducer and the microlens, wherein the plural unit pixels are arranged such that each of the photoelectric transducer is located in rotation symmetry with a rotation center at an approximate center of the light receiving surface.

(4) The solid-state imaging device of (3), wherein the plural unit pixels are arranged such that each of the photoelectric transducer is located in one of 90° rotation symmetry and 180° rotation symmetry with a rotation center at an appropriate center of the light receiving surface.

(5) The solid-state imaging device of (1), wherein the plural unit pixels are arranged such that each of the aperture section and each of the wiring layer comprising the plural layers are respectively located axisymmetrically with a symmetrical axis of the first centerline passing through an approximate center of the light receiving surface.

(6) The solid-state imaging device of (2), wherein the plural unit pixels are arranged such that each of the aperture section and each of the wiring layer comprising the plural layers are respectively located axisymmetrically with a symmetrical axis of the second centerline passing through an approximate center of the light receiving surface, the second center line being vertical to the first center line.

(7) The solid-state imaging device of (3), wherein the plural unit pixels are arranged such that each of the aperture section and each of the wiring layer comprising the plural layers are respectively located in rotation symmetry with a rotation center at an approximate center of the light receiving surface.

(8) The solid-state imaging device of (4), wherein the plural unit pixels are arranged such that each of the aperture section and each of the wiring layer comprising the plural layers are respectively located in one of 90° rotation symmetry and 180° rotation symmetry with a rotation center at an appropriate center of the light receiving surface.

(9) The solid-state imaging device described in any one of items (1)-(8), wherein a configuration and a located position, in the unit pixel, of the photoelectric transducer are respectively arranged axisymmetrically with a symmetrical axis of a third centerline passing through an approximate center of the unit pixel.

(10) The solid-state imaging device described in any one of items (1)-(8), wherein in each unit pixel, the photoelectric transducer is arranged such that along with the unit pixel approaching a periphery apart from the approximate center of the light receiving surface, the photoelectric transducer is gradually shifted toward the periphery of the light receiving surface.

(11) The solid-state imaging device described in any one of items (1)-(8), wherein a position of the microlens with respect to a position of the photoelectric transducer, in the unit pixel, is shifted such that the microlens is arranged nearer the appropriate center of the light receiving surface than the photoelectric transducer.

(12) The solid-state imaging device of (10), wherein in each unit pixel, the microlens is arranged such that along with the unit pixel approaching the periphery apart from the approximate center of the light receiving surface, the microlens is gradually shifted toward the periphery of the light receiving surface.

(13) The solid-state imaging device of (10), wherein in each unit pixel, along with the unit pixel approaching the periphery apart from the approximate center of the light receiving surface, relative positions between the plural layers of the wiring layer are gradually changed.

(14) The solid-state imaging device of (10), wherein in each unit pixel, along with the unit pixel approaching the periphery apart from the approximate center of the light receiving surface, relative positions between the wiring layer comprising plural layers and the photoelectric transducer are gradually changed.

According to the present invention, by arranging plural unit pixels such that the positions of the photoelectric transducers become symmetrical about a substantial center of the light receiving surface, it becomes possible to equalize conditions between incident light entering the respective unit pixels, to decrease the incident light not entering the photoelectric transducer, and to suppress decrease of amount of received light in the peripheral area of the light receiving surface. Thus, suppressing the uneven sensitivity (brightness shading) and uneven color (color shading) can be attained. For example, by arranging plural unit pixels so that positions of photoelectric transducers become axisymmetrical with the symmetrical axis of the centerline, it enables that incident light beams enter, with the same incident condition (particularly about incident angle), into the mutually axisymmetrically arranged photoelectric transducers. In this way, since the incident conditions become equal, the differences of amount of received light between top and bottom, or light and left portions of the light receiving surface become small, and generation of uneven sensitivity (brightness shading) and uneven color (color shading) can also be suppressed.

Further, since the position of the photoelectric transducer in each unit pixel is arranged such that along with going nearer the peripheral area from the substantial center of the light receiving surface, the position gradually shifts, and the incident light, which is the more slanted at points farther from the center of the light receiving surface, can be adequately received by the photoelectric transducer. Thus, the light not entering the photoelectric transducer, can be further reduced, leading to further suppressing of decrease of the amount of received light in the peripheral area of the light receiving surface. Due to this, the generation of uneven sensitivity (brightness shading) and uneven color (color shading) can be further suppressed.

Embodiments of the present invention will be explained by referring to FIGS. 1-9(c).

First Embodiment

A solid-state imaging device relating to the first embodiment of the present invention will be explained by referring to FIGS. 1-5(c).

(Structure)

Firstly, Structure of a Solid-State Imaging Device relating to the first embodiment will be explained by referring to FIGS. 1-3(c). FIG. 1 is a top view schematically showing the structure of the solid-state imaging device relating to the first embodiment of the present invention. FIGS. 2(a)-3(c) are sectional views schematically showing the structure of the unit pixel of the solid-state imaging device relating to the first embodiment of the present invention. FIGS. 2(a)-2(c) are sectional view taken on line B-B' of FIG. 1, and FIGS. 3(a)-3(c) are sectional view taken on line A-A' of FIG. 1.

As shown in FIG. 1, solid-state imaging device 1 relating to the first embodiment has a structure in which plural unit pixels 3 are arranged in two-dimensional matrix (m×n). In actual cases, the number of unit pixels are from several hundred thousand to several million, however in this explanation, (4×6) unit pixels are used for descriptive purposes.

In unit pixel 3, photodiode 4 is provided, which is a photoelectric transducer, to generate and accumulate signal charges according to incident light. Further, although not illustrated, unit pixel 3 comprises a read-out transistor to read out signals from the photodiode, an amplifier transistor to amplify the read-out signals, a row-selection transistor to select the row from which to read-out signals, and a reset transistor to reset signal charges.

In the area adjacent to unit pixel 3 in the row-direction, metal wiring layers for reset signal line and read-out signal line, and metal wiring layers for horizontal address signal line, etc. are provided in horizontal direction. Further, in the area adjacent to unit pixel 3 in the column-direction, metal wiring layers for vertical signal line, etc. are provided in vertical direction. These metal wiring layers 5 are schematically shown in FIGS. 2(a)-3(c).

As shown in FIGS. 2(a)-3(c), photodiode 4 is an embedded type photodiode, formed on the top surface of silicone substrate 8. On silicone substrate 8, plural layers of inter-layer film (not illustrated) are sequentially formed. On those inter-layer films, each metal wiring layer 5 such as for vertical signal line, reset signal line, read-out signal line, and horizontal address signal line is selectively formed. Further, on metal wiring layer 5, a light shielding layer (not illustrated) to light shield the area outside photodiode, and color filter 6 are formed. Further, on each unit pixel 3, microlens 7, which collects light for each unit pixel, is provided. Yet further, aperture 9 is formed on the light shield layer (not illustrated) to allow light enter onto photodiode 4.

Next, characteristics of the solid-state imaging device relating to the present embodiment will be described in detail. As shown in FIG. 1, the shape of aperture for photodiode 4 of this embodiment is a rectangle with edge in the Y-direction being longer than in the X-direction. Each unit pixel 3 is formed such that the position of aperture for photodiode 4 in each unit pixel 3 is placed symmetrically with top/bottom and right/left direction of the drawing with respect to center O. Namely, configuration of each unit pixel 3 is 180° rotation symmetrical with respect to the center of rotation symmetry at center O of light receiving surface 2.

Here, light receiving surface 2 is assumed to be divided into four regions of a, b, c, and d by centerline B-B', passing through center O and parallel to the X-direction, and centerline A-A', passing through center O and parallel to the Y-direction. When the light receiving surface is divided like this, configurations of unit pixels 3 included in regions a and b are axisymmetrical to those included in regions c and d, with respect to the symmetrical axis of centerline A-A'. Further, configurations of unit pixels 3 included in regions a and c are axisymmetrical to those included in regions b and d with respect to the symmetrical axis of centerline B-B'. This symmetrical property will now be described in further detail.

For example, when looking at unit pixel 3 included in region a, as shown in FIG. 3, photodiode 4 is formed by shifting to left side (toward the peripheral area in Y-direction) of the drawing from center O' of unit pixel 3, and by shifting to top side of the drawing (toward the peripheral area in X-direction).

Based on this configuration of unit pixel 3 included in region a, the configurations of unit pixels 3 included in regions b-d are determined. Structuring of unit pixels 3 included in region b are in axisymmetrical relation, with respect to symmetrical axis of centerline B-B', to respective unit pixels 3 included in region a. Namely, in each unit pixel 3 included in region b, photodiode 4 is formed with shifting it left (to the peripheral side of light receiving surface 2 in Y-direction), and further slightly shifting it bottom side in the drawing (toward the peripheral side of light receiving surface 2 in X-direction).

Structuring of unit pixels 3 included in region c are in axisymmetrical relation, with respect to a symmetrical axis of centerline A-A', to respective unit pixels 3 included in region a. Namely, in each unit pixel 3 included in region C, photodiode 4 is formed with shifting it toward the right side (toward the periphery of light receiving surface 2 in Y-direction), and further slightly shifting it toward the top of the drawing (toward the periphery of light receiving surface 2 in X-direction).

Further, structuring of unit pixels 3 included in region d is in axisymmetrical relation, with respect to symmetrical axes of centerline A-A' and centerline B-B', to respective unit pixels 3 included in region a. Namely, in each unit pixel 3 included in region d, photodiode 4 is formed with shifting it toward the right (toward the periphery of light receiving surface 2 in Y-direction), and further slightly shifting it toward the bottom of the drawing (toward the periphery of light receiving surface 2 in X-direction).

Shifting distances, in the X-direction and the Y-direction, of photodiodes 4 in respective unit pixels 3 included in regions b-d are identical to shifting distances in the X-direction and the Y-direction of photodiodes 4 in unit pixels 3 included in region a.

The cross section structure of unit pixels 3 in each region will be explained while referring to FIGS. 2(a)-3(c). First, the cross section taken along line B-B' will be explained while referring to FIGS. 2(a)-(c). FIG. 2(a) shows a cross-section view, taken along line B-B', of pixels included in regions a and b located on the left side of the drawing with respect to centerline A-A'. FIG. 2(c) shows a cross-section view, taken along line B-B', of pixels included in regions c and d located on the right side of the drawing with respect to centerline A-A'.

As shown in FIG. 2(a), photodiode 4 is formed at a position shifted toward the left (toward the periphery in Y-direction) of the drawing from center O' of unit pixel 3. Further, metal wiring layer 5 and the light shielding layer (not illustrated) formed on silicone substrate 8 are also formed at positions shifted toward the left (toward the periphery in Y-direction) of the drawing from center O' of unit pixel 3. Namely, aperture section 9 is formed at positions shifted toward the left (toward the periphery in Y-direction) of the drawing from center O' of unit pixel 3.

Further, structuring of each unit pixel 3 included in regions c and d shown in FIG. 2(c) is in symmetrical relationships to the structure of unit pixel 3 shown in FIG. 2(a). That is, photodiode 4 is formed at a position shifted toward the right (toward the periphery in Y-direction) of the drawing from center O' of unit pixel 3. Further, metal wiring layer 5 and the light shielding layer (not illustrated) formed on silicone substrate 8 are also formed at positions shifted toward the right (toward the periphery in Y-direction) of the drawing from center O' of unit pixel 3. Namely, aperture section 9 is formed at positions shifted toward the right (toward the periphery in Y-direction) of the drawing from center O' of unit pixel 3.

In this way, structuring of unit pixels 3 included in regions a and b are in axisymmetrical relationships to the structuring of unit pixels 3 included in regions c and d, with respect to the symmetrical axis of centerline A-A'.

Next, cross sections taken along line A-A' are explained by referring to FIGS. 3(a)-(c). FIG. 3(a) shows a cross-section view, taken along line A-A', of a pixel included in regions a and c located at the top side of the drawing with respect to centerline B-B'. FIG. 3(c) shows a cross-section view, taken along line A-A', of a pixel included in regions b and d located at the bottom side of the drawing with respect to centerline B-B'.

As shown in FIG. 3(a), photodiode 4 is formed at a position shifted toward the left (toward the periphery in X-direction) of the drawing from center O' of unit pixel 3. Further, metal wiring layer 5 and the light shielding layer (not illustrated) formed on silicone substrate 8 are also formed at positions shifted toward the left (toward the periphery in X-direction) of the drawing from center O' of unit pixel 3. Namely, aperture section 9 is formed at positions shifted toward the left (toward the periphery in X-direction) of the drawing from center O' of unit pixel 3.

Further, structuring of each unit pixel 3 included in regions b and d shown in FIG. 3(c) is in symmetrical relationships to the structuring of unit pixel 3 shown in FIG. 3(a). That is, photodiode 4 is formed at a position shifted toward the right (toward the periphery in X-direction) of the drawing from center O' of unit pixel 3. Further, metal wiring layer 5 and the light shielding layer (not illustrated) formed on silicone substrate 8 are also formed at positions shifted toward the right (toward the periphery in X-direction) of the drawing from center O' of unit pixel 3. Namely, aperture section 9 is formed at positions shifted toward the right (toward the periphery in X-direction) of the drawing from center O' of unit pixel 3.

In this way, structuring of unit pixels 3 included in regions a and c is in axisymmetrical relationships to the structuring of unit pixels 3 included in regions b and d, with respect to the symmetrical axis of centerline A-A'.

As described above, the structuring of unit pixel 3 included in each region (formed positions of photodiode 4, metal wiring layer 5, and aperture section 9) is in axisymmetrical relationships with respect to the symmetric axes of centerline A-A' and centerline B-B'.

(Functions)

Figures 4A, 4B, 4C:
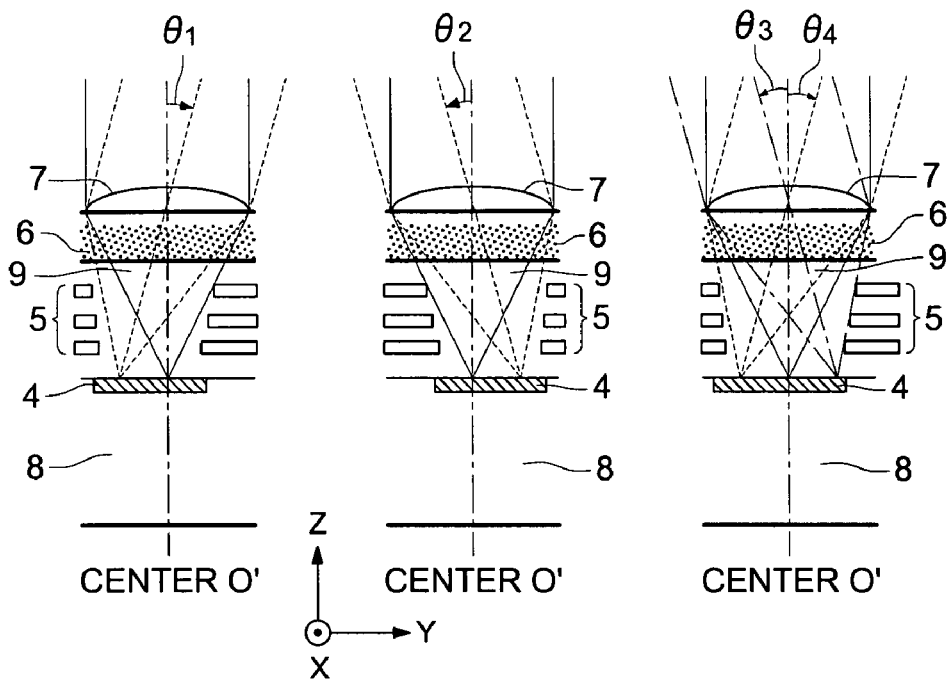
FIGS. 4(a)-(c) are sectional views of the unit pixels illustrating the operation of the solid-state imaging device relating to the first embodiment of the present invention.
Figure 5A:
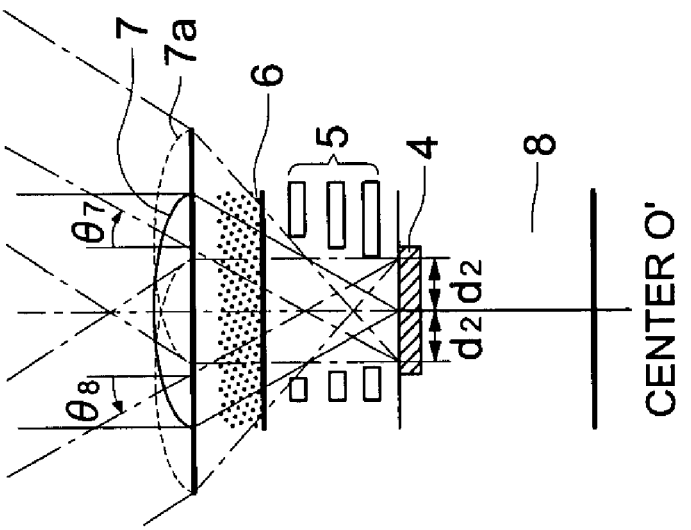
FIGS. 5(a)-(c) are sectional views of the unit pixels illustrating the operation of the solid-state imaging device relating to the first embodiment of the present invention.
Figure 5B:
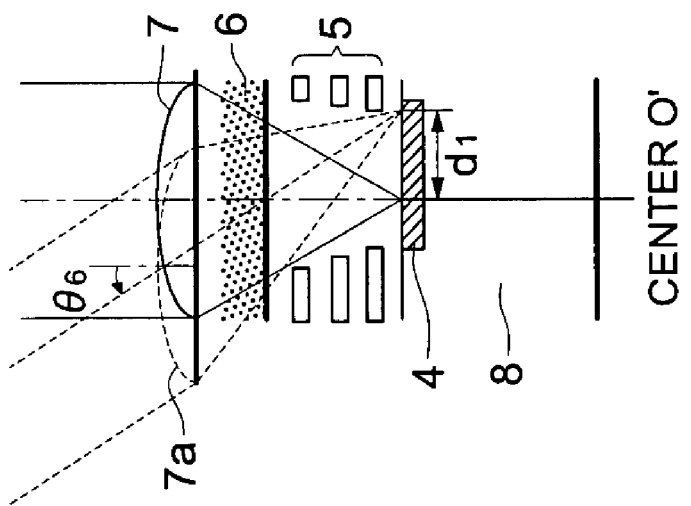
Figure 5C:
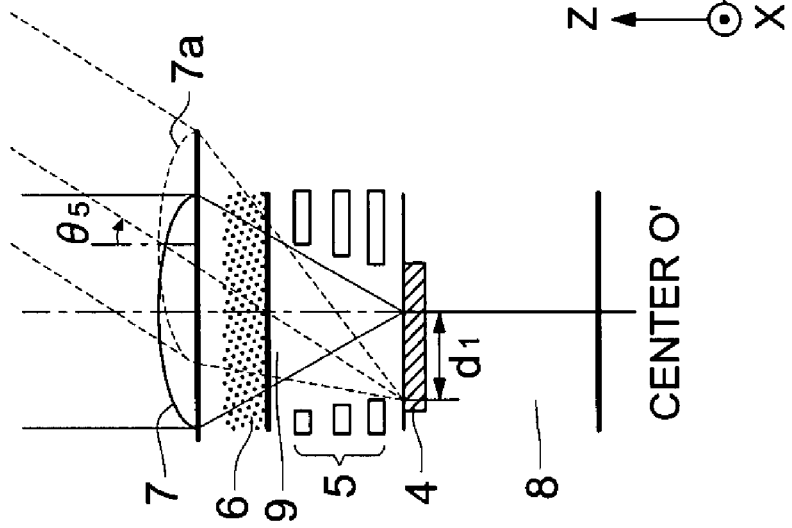

According to solid-state imaging device 1 having the above-described structure, the following functions and effects can be realized. Functions of the solid-state imaging device relating to the first embodiment will be described while referring to FIGS. 2(a)-5(c). FIGS. 4(a)-(c) and 5(a)-(c) are cross sectional views of unit pixels to explain the functions of solid-state imaging device relating to the first embodiment. FIGS. 4(a)-(c) are cross sectional views taken along line B-B' in FIG. 1, to explain the functions when there is no shifting of microlens position. FIGS. 4(a)-(b) are drawings to explain the functions of the solid-state imaging device relating to the first embodiment, while FIG. 4(c) is a drawing to explain the functions of the solid-state imaging device relating to conventional art devices. FIGS. 5(a)-(c) are cross sectional views taken along line B-B' in FIG. 1, to explain the functions when the microlens position has been shifted. FIGS. 5(a)-(b) are drawings to explain the functions of the solid-state imaging device relating to the first embodiment, while FIG. 5(c) is a drawing to explain the functions of the solid-state imaging device relating to conventional art devices.

Incident light from Z-direction (namely vertical to the drawing sheet of FIG. 1) enters almost vertically into light receiving surface 2 in the area near center O of light receiving surface 2, while it enters more aslant nearer toward the periphery of light receiving surface 2. For example, n regard to unit pixel 3 arranged near center O of light receiving surface 2, the incident light enters almost vertically as shown in FIGS. 2(b) and 3(b). Meanwhile, in regard to unit pixel 3 arranged near the periphery of light receiving surface 2, the incident light enters aslant as shown in FIGS. 2(a), 2(c), 3(a) and 3(b).

For example, into unit pixel 3 arranged at left side in FIG. 1 with respect to centerline A-A' and near the periphery of light receiving surface 2, the incident light enter aslant from right to left (from center O of light receiving surface 2 toward the periphery) as shown in FIG. 2(a). Since photodiode 4 and aperture section 9, etc. are arranged being shifted toward the left (toward the periphery) with respect to center O' of unit pixel 3 corresponding to the incident light entering aslant, the incident light is not reflected by the light shielding layer (not illustrated) or metal wiring layer 5, etc., and enters into photodiode 4.

Similarly, into unit pixel 3 arranged at the right in FIG. 1 with respect to centerline A-A' and near the periphery of light receiving surface 2, the incident light enters aslant from left to right (from center O of light receiving surface 2 toward the periphery) as shown in FIG. 2(c). Since photodiode 4 and aperture section 9, etc. are arranged being shifted toward the right (toward the periphery) with respect to center O' of unit pixel 3 corresponding to the incident light entering aslant, the incident light is not reflected by the light shielding layer (not illustrated) or metal wiring layer 5, etc., and it enters into photodiode 4.

Further, into unit pixel 3 arranged at the top side in FIG. 1 with respect to centerline B-B' and near the periphery of light receiving surface 2, the incident light enter aslant from right toward the left (from center O of light receiving surface 2 toward the periphery) as shown in FIG. 3(a). In FIG. 1, the incident light enters aslant from bottom side to top side of the drawing. Since photodiode 4 and aperture section 9, etc. are arranged being shifted toward the right (toward the periphery or toward the top side in FIG. 1) with respect to center O' of unit pixel 3 corresponding to the incident light entering aslant, the incident light is not reflected by the light shielding layer (not illustrated) or metal wiring layer 5, etc., and it enters into photodiode 4.

Similarly, into unit pixel 3 arranged at bottom side with respect to centerline B-B' and near the periphery of light receiving surface 2 in FIG. 1, the incident light enters aslant from left to right (from center O of light receiving surface 2 to the periphery side) as shown in FIG. 3(c). In FIG. 1, the incident light enters aslant from top toward the bottom of the drawing. Since photodiode 4 and aperture section 9, etc. are shifting toward the right (toward the periphery: or toward the bottom in FIG. 1) with respect to center O' of unit pixel 3 corresponding to the diagonal incident light, the incident light is not reflected by the light shielding layer (not illustrated) nor by metal wiring layer 5, etc., and enters into photodiode 4.

In this way, since the structures (forming positions of photodiode 4, metal wiring layer 5, and aperture section 9, etc.) of unit pixel 3 are in top/bottom and right/left axisymmetrical relationship with respect to the symmetric axes passing through center O of light receiving surface 2, incident conditions of the light can be made nearly identical for every unit pixels 3 on light receiving surface 2, therefore, it becomes possible to suppress brightness shading and color shading to a minimum level. Further, since the incident light is not reflected by the light shielding layer nor by metal wiring layer 5, etc., the incident light not entering into photodiode 4 can be minimized, thus, it becomes possible to suppress a decrease of receiving light in the peripheral side of light receiving surface 2.

Further, according to solid-state imaging device 1 relating to the first embodiment, aslant light having larger incident angle can enter photodiode 4, than that for the conventional solid-state imaging devices. This function will be explained by referring to FIG. 4, in which light beams irradiated onto unit pixel 3 arranged near center O of light receiving surface 2 are represented by solid lines, while light beams irradiated to unit pixel 3 arranged near the periphery of light receiving surface 2 are represented by broken lines or dashed-dotted lines. Incident angles of light beams to unit pixel 3, are represented by $\theta_1$-$\theta_4$. The incident angle is defined as an angle from the direction vertical to unit pixel 3.

By referring to FIGS. 4(a) and (c), the incident angle of light beams to unit pixel 3 arranged on the left (namely regions a and b) with respect to centerline A-A', and near the periphery of light receiving surface 2 will be described. Onto unit pixel 3 arranged at the left (namely regions a and b), the incident light beams enter aslant from right to left (from center O of light receiving surface 2 to the periphery) as shown in FIGS. 4(a) and (c), in which these incident light beams are represented by broken lines.

As shown in FIG. 4(a), in solid-state imaging device 1 relating to the present invention, slanted incident light beams with incident angle $\theta_1$ are able to enter onto photodiode 4. While, as shown in FIG. 4(c), in solid-state imaging device 1 relating to a conventional art, slanted incident light beams with incident angle $\theta_3$ are able to enter onto photodiode 4. In these cases, the magnitude relationship of incident angles is $\theta_1 > \theta_3$.

Next, by referring to FIGS. 4(b) and (c), the incident angle of the light beam onto unit pixel 3 arranged on the right (namely regions c and d) with respect to centerline A-A', and near the periphery of light receiving surface 2 will be described. Onto unit pixel 3 arranged at the right, the incident light beams enter aslant from left to right (from center O of light receiving surface 2 to the periphery side) as shown in FIGS. 4(b) and (c). In FIG. 4(b), these incident light beams are represented by broken lines, and in FIG. 4(c), these incident light beams are represented by dashed-dotted lines.

As shown in FIG. 4(b), in solid-state imaging device 1 relating to the present invention, slanted incident light beams with incident angle $\theta_2$ can enter onto photodiode 4. While, as shown in FIG. 4(c), in solid-state imaging device 1 relating to conventional art, slanted incident light beams with incident angle $\theta_4$ can enter onto photodiode 4. In these cases, the magnitude relationship of incident angles is $\theta_2 > \theta_4$. This is because in unit pixel 3 of solid-state imaging device 1 relating to the present invention, photodiode 4 and aperture section 9, etc. are formed being shifted toward the right (toward the periphery of light receiving surface) with respect to center O' of unit pixel 3 as shown in FIG. 4(b).

As described above, according to solid-state imaging device 1 relating to the first embodiment, since each unit pixel 3 is axisymmetrically arranged with the symmetric axes of centerlines A-A' and B-B', slanted incident light beams with larger incident angle are allowed to enter onto photodiode 4, compared to the solid-state imaging device of conventional art. In the case of FIG. 4(c), photodiode 4 needs to be structured to maintain good balance with respect to both incident light beams from both the right and left. In contrast, in cases of FIGS. 4(a) and (b), since only one of right or left beams need to be taken into consideration, light beams of a larger incident angle are acceptable.

Next, a variation of solid-state imaging device 1 relating to the present embodiment will be described while referring to FIG. 5. In this variation, the case of shifting microlens 7 is explained, whereby even in a solid-state imaging device relating to conventional art, slanted light beams can be allowed to enter onto photodiode 4. However, according to solid-state imaging device 1 relating to the present embodiment, since incident conditions of light beams reaching photodiode 4 can be maintained well, the uneven sensitivity (brightness shading) and uneven color (color shading) can be suppressed.

In FIGS. 5(a)-(c), comparison between the present embodiment and a conventional art is shown in the case where incident light angles are identical. FIG. 5(a) shows a cross sectional view of unit pixel 3 arranged on the left (regions a and b) with respect to centerline A-A', and near the periphery of light receiving surface 2. FIG. 5(b) shows a cross sectional view of unit pixel 3 arranged on the right (regions c and d) with respect to centerline A-A', and near the periphery of light receiving surface 2. FIG. 5(c) shows a cross sectional view of a unit pixel of the conventional art. In this variation, microlens 7a is arranged by shifting toward the side of center O of light receiving surface 2. Namely, photodiode 4 and microlens 7a are arranged such that microlens 7a is located nearer to center O of light receiving surface 2 than photodiode 4. In FIGS. 5(a)-(c), microlens 7a, arranged by shifting toward the side of center O of light receiving surface 2 is represented by broken lines or dashed-dotted lines.

As shown in FIG. 5(a), onto unit pixel 3, arranged on the left (regions a and b) with respect to centerline A-A' and near the periphery of light receiving surface 2, incident light beams enter aslant from right to left on the drawing (from center O of light receiving surface 2 toward the periphery) with incident angle $\theta_5$. Further, as shown in FIG. 5(c), to unit pixel 3 of conventional art, incident light beams enter aslant from right to left on the drawing with the incident angle $\theta_7$. The incident light beams aslant from right to left are represented by broken lines in FIG. 5(a), and by dashed-dotted lines in FIG. 5(c). Further, microlens 7a is arranged by shifting toward the right of the drawings (toward center O of light receiving surface 2).

As shown in FIG. 5(b), to unit pixel 3, arranged on the right (regions c and d) with respect to centerline A-A' and near the periphery of light receiving surface 2, incident light beams enter aslant from left to right on the drawing (from center O of light receiving surface toward the periphery) with the incident angle $\theta_6$. Further, as shown in FIG. 5(c), onto unit pixel 3 of conventional art, incident light beams enter aslant from left to right on the drawing with the incident angle $\theta_8$. The incident light beams aslant from left toward right are represented by broken lines in FIG. 5(b), and by dashed-dotted lines in FIG. 5(c). Further, microlens 7a is arranged by shifting toward the left of the drawings (toward center O of light receiving surface 2).

By arranging microlens 7a with shifting toward center O of light receiving surface 2, even in the conventional art, aslant incident light beams, whose focused position are shifted from center O', can be received. However, according to the solid-state imaging device of this embodiment, aslant incident light beams, whose focused position are further shifted from center O' can be received. As shown in FIGS. 5(a) and (b), in this embodiment, the incident light beams whose focused positions are shifted within d1 from center O' can be received. Meanwhile, as shown in FIG. 5(c), in conventional art, the incident light beams whose focused positions are shifted within d2 from center O' can be received. Here, since d1>d2, the incident light beams with more shifted focused positions are received according to this embodiment. In these cases, the relationships of incident light beam angles are: $\theta_5 > \theta_7$, $\theta_6 > \theta_8$ ($\theta_5 = \theta_6$, $\theta_7 = \theta_8$). In this way, even incident light beams with large incident angles can be received with better conditions than in conventional art. Therefore, in cases of identical incident angles, in the solid-state imaging device relating to the present embodiment incident conditions of light beams become better than in conventional art, thus, uneven sensitivity (brightness shading) and uneven color (color shading) can be more suppressed than in conventional art.

Further, solid-state imaging devices having unit pixel structures shown in FIGS. 9(a)-(c) also work well. For example, in cases where unit pixel 3 are used, in which photo diodes 4 are formed in right/left bilateral symmetry with respect to a centerline passing through center O' of unit pixel 3 as shown in FIG. 9(a), such a solid-state imaging device, bilaterally symmetrical in both top/bottom and right/left directions, as shown in FIG. 1 can be formed, by arranging these unit pixels 3 top/bottom in bilateral symmetry with respect to centerline B-B' of light receiving surface 2.

In cases where unit pixels 3 are used, in which photo diodes 4 are formed in top/bottom bilateral symmetry with respect to a centerline passing through center O' of unit pixel 3 as shown in FIG. 9(b), such a solid-state imaging device, bilaterally symmetrical in both top/bottom and right/left directions, as shown in FIG. 1 can be formed, by arranging these unit pixels 3 in right/left bilateral symmetry with respect to centerline A-A' of light receiving surface 2.

In the present invention, photodiode 4 is not necessarily arranged in either top/bottom or right/left bilateral symmetry in unit pixel 3. For example, even in cases where unit pixels 3 having an asymmetrical configuration as shown in FIG. 9(c) are used, by arranging these unit pixels 3 in top/bottom and right/left bilateral symmetry with respect to centerlines B-B' and A-A' of light receiving surface 2, such a solid-state imaging device as shown in FIG. 1 can be obtained. Therefore, even when photodiode 4, etc. are not formed symmetrically, the effects of the present invention can still be attained.

Further, in the first embodiment, photodiode 4 has a rectangular surface with a longer side in Y-direction than that in X-direction, however, photodiode 4 having a square surface with sides of the same length in both the X and Y-directions also works well. When unit pixels 3 having such square photodiodes 4 are arranged in bilateral symmetry with respect to centerlines A-A' and B-B', unit pixels 3 in all regions a-d become in 90° rotation symmetry with respect to a rotation center of center O of light receiving surface 2. As described above, configuration of unit pixel 3 becomes 180° rotation symmetrical as well as 90° rotation symmetrical according to the shapes of photodiode 4.

Second Embodiment

Figure 6:
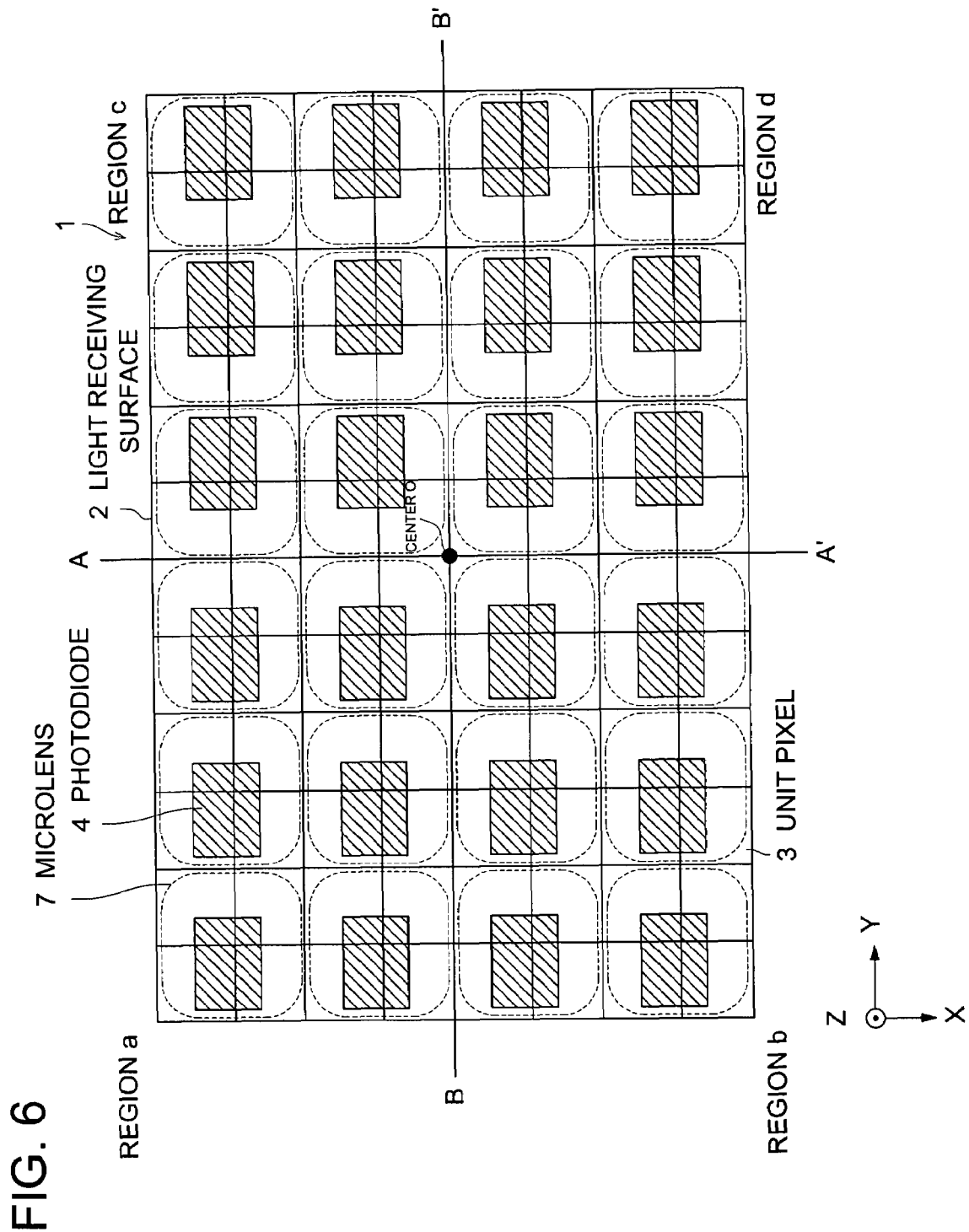
FIG. 6 is a top view schematically showing the structure of the solid-state imaging device relating to the second embodiment of the present invention.

A solid-state imaging device relating to the second embodiment of the present invention will be described by referring to FIG. 6. FIG. 6 is a plan view schematically illustrating a structure of the solid-state imaging device relating to the second embodiment of the present invention.

In this embodiment, photodiode 4 has a rectangular surface having a longer side in Y-direction than in X-direction similarly to that of solid-state imaging device 1 in the first embodiment. The structure of each unit pixel 3 in solid-state imaging device 1 of the first embodiment is axisymmetrical with respect to symmetrical axes of centerlines A-A' and B-B', each passing through the center of light receiving surface 2. On the other hand, the structure of each unit pixel 3 in solid-state imaging device 1 of the second embodiment is axisymmetrical with respect to symmetrical axes of centerlines A-A' passing through the center O. Namely, in every pixel unit 3 included in regions a and b, photodiode 4 and aperture section 9, etc. are arranged in the same relative positions, and in every pixel unit 3 included in regions c and d, photodiode 4 and aperture section 9, etc. are arranged in axisymmetrical positions to those in regions a and b with respect to symmetrical axis of centerline A-A'.

In this way, as shown in FIG. 6, by forming each unit pixel 3 in right/left bilateral symmetry with respect to centerline A-A', incident light beams enter aslant the peripheral area of light receiving surface 2, as shown in FIG. 2 for example, can be received by photodiode 4 without being reflected by a light shielding layer or metal wiring layer 5, etc. Thus, a decrease in the amount of received light in the peripheral areas can be suppressed, and uneven sensitivity (brightness shading) and uneven color (color shading) can be minimized.

In solid-state imaging device 1 relating to this embodiment, since each unit pixel 3 is not formed to be top/bottom bilaterally symmetrical with respect to center line B-B' in FIG. 6, shading in the top/bottom direction is caused, while, generation of the shading in the right/left direction can be suppressed. Further, each unit pixel 3 may be formed to be top/bottom symmetrical with respect to centerline B-B' in FIG. 6. In this case, shading generation in top/bottom direction can be suppressed. As explained in the first embodiment, to suppress the shading generation in the top/bottom direction, each unit pixel is formed in bilateral symmetry in top/bottom and right/left directions. Meanwhile, light receiving surface 2 is usually shaped as a rectangle with longer lateral (right/left) sides, and since the incident light angle becomes larger, the uneven sensitivity (brightness shading) and uneven color (color shading) tend to be generated in the longitudinal direction. Therefore, if each unit pixel is arranged axisymmetrically with respect to a centerline, even if only in the lateral direction, the generation of brightness shading, etc. can be suppressed to represent a beneficial effect.

Further by simply utilizing unit pixel 3 shown in FIG. 9(a) or (b), a solid-state imaging device of right/left bilateral symmetry as shown in FIG. 6 or of top/bottom bilateral symmetry can be obtained. Further, in this invention, photodiode 4 is not necessarily arranged to be top/bottom symmetrical or right/left symmetrical in unit pixel 3. For example, even when unit pixels 3, having an asymmetrical structure in the unit pixel as shown in FIG. 9(c), are utilized, by arranging the unit pixels in right/left bilateral symmetry with respect to center line A-A' of light receiving surface 2, such a solid-state imaging device as shown in FIG. 6 can be obtained. Then, if the unit pixels are further arranged in top/bottom symmetrically, such a solid-state imaging device as shown in FIG. 1 can be obtained. Thus, even if photodiode 4, etc. are not formed symmetrically in unit pixel 3, the effect of the present invention can be represented.

Third Embodiment

Figure 7:
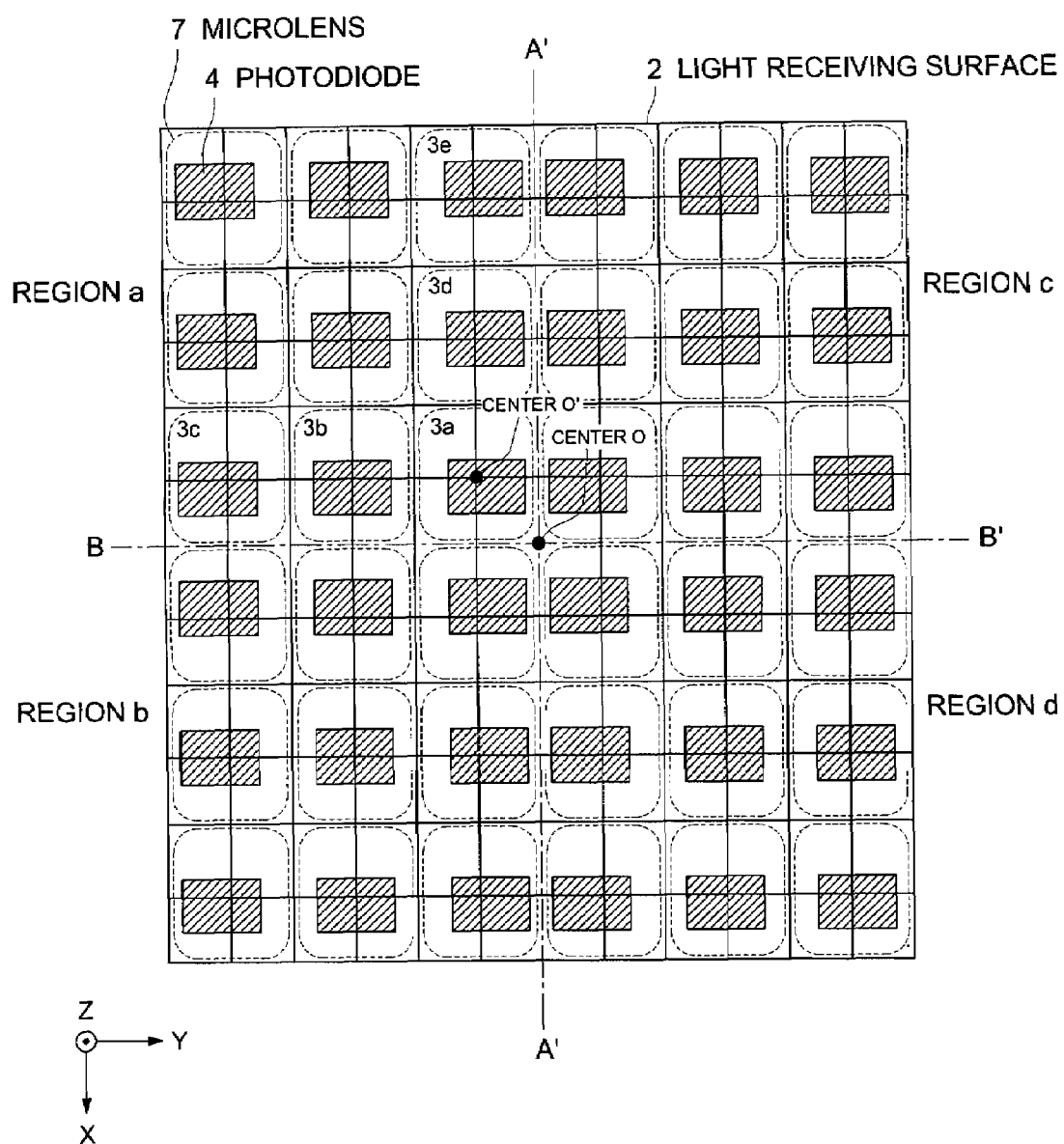
FIG. 7 is a top view schematically showing the structure of the solid-state imaging device relating to the third embodiment of the present invention.
Figure 10:
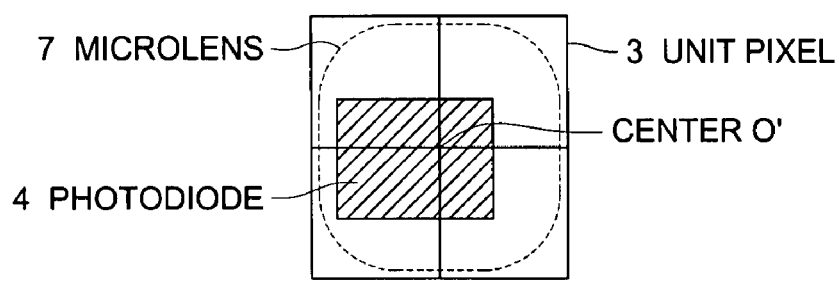
FIGS. 10(a) and (b) are top and sectional views respectively showing a structure of a solid-state imaging device.
Figure 10:
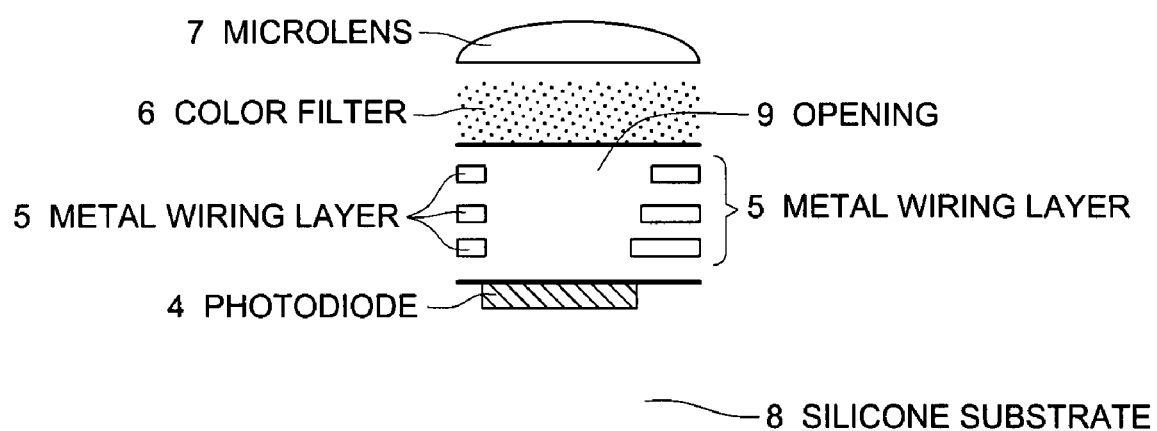
Figure 11:
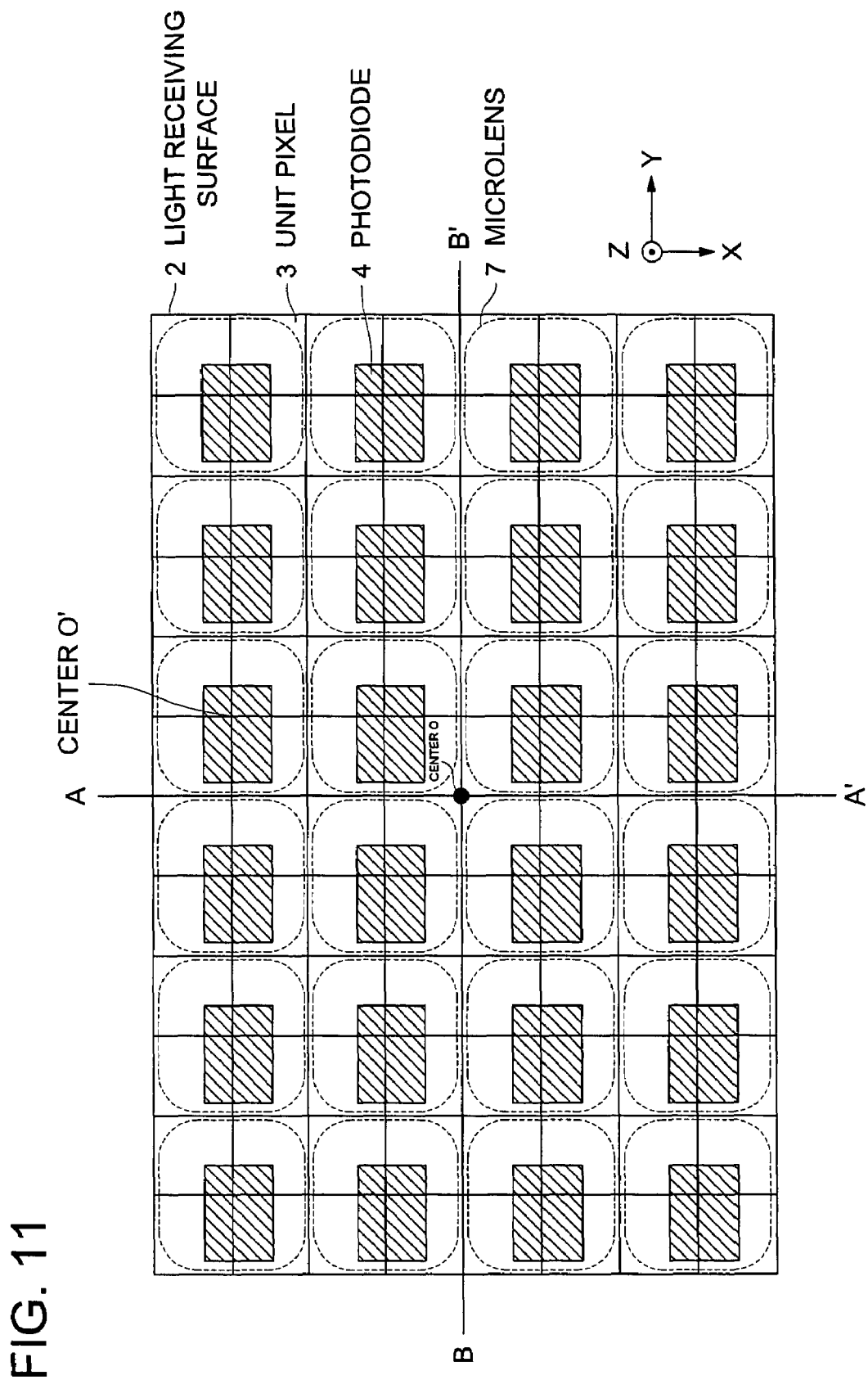
FIG. 11 is a top view showing an arrangement of photoelectric transducers in a solid-state imaging device relating to conventional technology.
Figure 12:
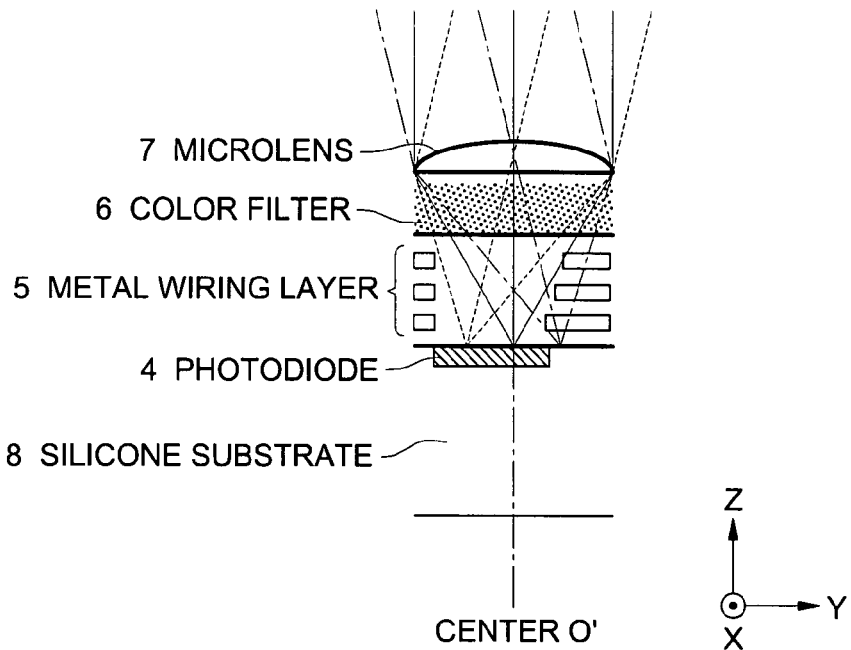
FIG. 12 is a sectional view for illustrating the operation of a solid-state imaging device relating to conventional technology.
Figure 13:
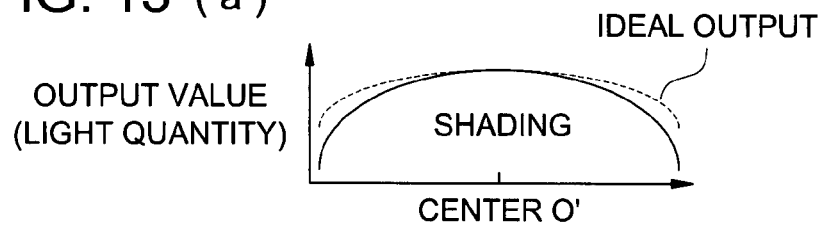
FIGS. 13(a)-(c) are graphs showing the amount of light received by a solid-state imaging device relating to conventional technology.
Figure 13:
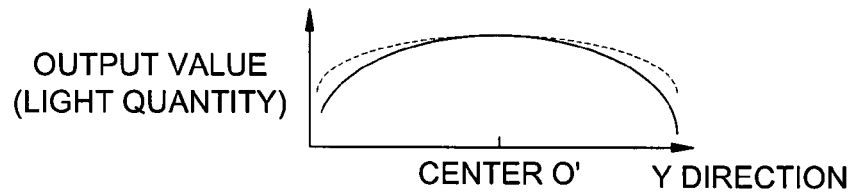
Figure 13:
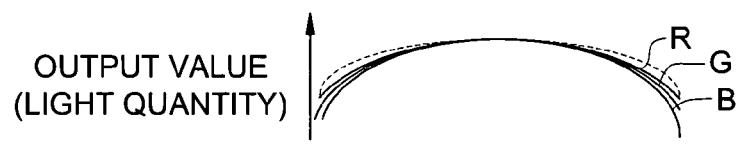

Next, the solid-state imaging device relating to the third embodiment of the present invention will be described by referring to FIGS. 7 and 8(a)-(b). FIG. 7 is a plan view schematically illustrating a structure of the solid-state imaging device relating to the third embodiment of the present invention. FIGS. 8(a)-(b) are cross-sectional views of unit pixels to explain effects of the solid-state imaging device relating to the third embodiment.

(Structure)

As Shown in FIG. 7, Similarly to the Solid-State imaging device relating to the first embodiment, in the solid-state imaging device relating to the third embodiment, each unit pixel 3 is in axisymmetrical relationship with respect to symmetrical axes of centerlines A-A' and B-B', each passing through center O of light receiving surface 2. In the third embodiment, it is characteristic that positions of photodiodes 4, etc. are gradually shifted along with going near the periphery from center O of light receiving surface. Namely, since the incident angle, from a vertical direction, of incident light beams entering unit pixel 3 becomes the greater, as unit pixel 3 approaches the periphery, the position of photodiode 4, etc. are shifted toward the periphery within unit pixel 3, corresponding to the incident angle.

Here, taking an example of unit pixel 3 included in region a, variation of positions will be specifically described. Wherein, the shape of photodiode 4 is the same as the one in solid-state imaging device 1 relating to the first embodiment, namely a rectangle. Among unit pixels 3 included in region a, unit pixel 3a arranged near center O is assumed as a standard. For example, in unit pixel 3b arranged at the left (toward the periphery of light receiving surface in Y-direction) from near center O, photodiode 4 is shifted a little to left side (toward the periphery of the light receiving surface 2 in Y-direction) compared with the position of photodiode 4 formed in unit pixel 3a arranged near center O. In unit pixel 3c arranged at farther left (toward the periphery of light receiving surface in Y-direction), photodiode 4 is shifted farther left (toward the periphery of light receiving surface 2 in Y-direction). Namely, photodiode 4 is formed at a gradually shifted position toward the periphery within unit pixel 3, along with unit pixel 3 located nearer to the periphery from center O of light receiving surface 2.

Further, in unit pixel 3d arranged at top side above center O (at peripheral side of light receiving surface 2 in X-direction), photodiode 4 is shifted a little toward the top (toward the periphery of light receiving surface 2 in X-direction) compared to the position of photodiode 4 formed in unit pixel 3a arranged near center O. In unit pixel 3e arranged farther toward the top (toward the periphery of light receiving surface 2 in X-direction), photodiode 4 is shifted farther toward the top (toward the periphery of light receiving surface 2 in X-direction). Namely, photodiode 4 is formed at a gradually shifted position toward the periphery within unit pixel 3, as unit pixel 3 being located nearer to the periphery apart from center O of light receiving surface 2.

As described above, photodiode 4 is formed at a gradually shifted position toward the periphery within unit pixel 3, as unit pixel 3 approaches the periphery from center O of light receiving surface 2.

Since configuration of each unit pixel 3 included in regions b-d is formed, similarly to in the first embodiment, axisymmetrically to the configuration of unit pixel 3 included in region a with respect to symmetrical axes of centerlines A-A' and B-B', photodiode 4 is formed at a gradually shifted position toward the periphery within unit pixel 3, as approaching the periphery apart from center O of light receiving surface 2, in the same manner as in unit pixel 3 included in region a.

Here, a cross sectional structure of unit pixel 3 will be described by referring to sectional views shown in FIGS. 8(a)-(b). FIGS. 8(a)-(b) are sectional views taken along a line B-B' shown in FIG. 7. FIG. 8(a) is a sectional view showing a cross sectional structure of unit pixel 3c arranged at the left (namely regions a-b) with respect to center line A-A' in FIG. 7 and at periphery side of light receiving surface 2. FIG. 8(b) is sectional view showing a cross sectional structure of unit pixel 3c arranged near center O (in regions a-b) of light receiving surface 2.

As shown in FIG. 8(b), in regard to unit pixel 3a arranged near center O of light receiving surface 2, photodiode 4 is formed at the position slightly shifted from center O' of unit pixel 3a in Y-direction (toward the left of the drawing). Further, metal wiring layers 5 and light shield layer (not illustrated) are respectively formed being slightly shifted from center O' of unit pixel 3a in Y-direction (toward the left of the drawing).

On the other hand, as shown in FIG. 8(a), in regard to unit pixel 3c arranged near the periphery of light receiving surface 2, photodiode 4 is formed being shifted farther from center O' of unit pixel 3a in Y-direction toward the left (toward the periphery in Y-direction) than in the case of unit pixel 3a. Namely, photodiode 4 in pixel unit 3c, is arranged at the position being shifted farther toward the left of the drawing (toward the periphery in Y-direction) than photodiode 4 in unit pixel 3a. Further, structuring of metal wiring layer 5 composed of plural layers is arranged at the position further being shifted toward the left of the drawing (toward the periphery in Y-direction) than in the case of unit pixel 3a. Namely, metal wiring layer 5 of unit pixel 3c is arranged at the position farther shifted toward the periphery than metal wiring layer 5 of unit pixel 3a.

Structure of this metal wiring layer 5 will be described in detail. As shown in FIGS. 8(a)-(b), in cases where metal wiring layers 5 are composed of three layers, metal wiring 5a formed at the bottom is arranged at the position farther shifted toward the left (toward the periphery in Y-direction) than in the case of unit pixel 3a. Namely, metal wiring 5a of pixel unit 3c, is arranged being further shifted toward the periphery. Metal wiring 5b, formed above metal wiring 5a, is arranged being shifted toward the right of the drawing (toward center O of light receiving surface in Y-direction) compared to metal wiring 5a. Further, metal wiring 5c, formed above metal wiring 5b, is arranged being farther shifted toward the right of the drawing (toward center O of light receiving surface 2 in Y-direction) compared to metal wiring 5b. This metal wiring 5c is formed at the top of metal wiring layer 5 in unit pixel 3a. In this way, metal wiring layers 5 are formed such that along with going from metal wiring 5c formed at the top to metal wiring 5a formed at the bottom, positions of the metal wirings are gradually shifted toward the periphery (toward the left of the drawing).

Further, color filter 6 of unit pixel 3c is arranged being shifted toward the right of the drawing (toward center O of light receiving surface 2 in Y-direction) compared to color filter 6 of unit pixel 3a. In unit pixel 3c arranged near the periphery of light receiving surface 2, microlens 7a is arranged being shifted from center O' toward the right of the drawing (toward center O of light receiving surface 2 in Y-direction). In unit pixel 3 arranged near center O of light receiving surface 2, microlens 7 is not shifted but arranged at approximate center of unit pixel 3a. Then, similarly to photodiode 4, color filter 6 and microlens 7a are respectively formed in unit pixel 3 at gradually shifted positions toward the center O of light receiving surface, as going nearer to the periphery apart from center O of light receiving surface 2.

As described above, as going nearer to the periphery from center O of light receiving surface 2, photodiode 4 and metal wiring layers 5 are gradually shifted toward the periphery of light receiving surface 2, and color filter 6 and microlens 7 are gradually shifted toward center O of light receiving surface 2. In other words, as going nearer to the periphery from center O of light receiving surface 2, shifts of relative positions between metal wiring 5a and 5c, shifts of relative positions between metal wiring 5 and photodiode 4, and shifts of relative positions between photodiode 4 and microlens 7 become greater. In this way, the solid-state imaging device of this embodiment is formed, by varying the configuration of each pixel unit 3.

Such as color filter 6 and microlens 7a are formed, by using masks whose dimensions are gradually varied. Further, masks, whose dimensions between metal wiring 5a-5c, and dimensions between metal wiring layers 5 and photodiode 4 are gradually varied, are used to form pixel units 3.

(Functions)

In regard to unit pixel 3a arranged near center O of light receiving surface, incident light enters approximately vertically. Meanwhile, in regard to unit pixel 3b arranged nearer the periphery of light receiving surface than unit pixel 3a, incident light enters aslant. Then, in regard to unit pixel 3c arranged nearer the periphery of light receiving surface than unit pixel 3b, incident light enters more aslant (in greater incident angle) than in regard to unit pixel 3b. Similarly, in regard to unit pixels 3d and 3e, respective incident angles become gradually greater as going nearer toward the periphery. With regard to the incident light, whose incident angle becomes greater as going nearer to the periphery, the following functions and effects can be realized, according to solid-state imaging device 1 having the above-described structures.

In the vicinity of center O of light receiving surface 2, the incident light, which is represented by solid lines in FIG. 8(b), vertically enters photodiode 4. And, near the periphery of light receiving surface 2, the incident light, which is represented by solid lines in FIG. 8(a), enters aslant to photodiode 4. In this case, since photodiode 4 in unit pixel 3c, arranged near the periphery, is farther shifted to the left of the drawing than in the case of unit pixel 3a, the incident light entered aslant is irradiated near the center of photodide 4.

Incidentally, if unit pixel 3a having the structure shown in FIG. 8(b) is arranged near the periphery of light receiving surface 2, and microlens 7a is shifted toward the right (toward center O of light receiving surface in Y-direction) from center O', the incident light enters aslant, as represented by broken lines, is irradiated on the edge of photodiode 4.

Although, in this way, as going nearer to the periphery of light receiving surface 2, the incident light enters more aslant with gradually increasing incident angle, by shifting the position of photodiode 4 toward the periphery of light receiving surface 2 as the unit pixel locates nearer the periphery, the incident light, which enters more aslant as apart from center of light receiving surface 2, can be received at near the center of photodiode 4 in preferable conditions. Due to this, the amount of received light near the periphery can be further improved, compared to in the case of solid-state imaging device 1 relating to the first embodiment. This enables to further suppress the brightness shading and the color shading. Namely, by forming each unit pixel 3 in accordance with the incident light angle, the each unit pixel can receive the incident light in preferable conditions.

APPLICABILITY IN THE INDUSTRY

According to the present invention, by correcting the brightness shading and the color shading, the uneven sensitivity and uneven color can be suppressed in the solid-state imaging device.

What is claimed is:

1. A solid-state imaging device comprising:
a light receiving surface, in which plural unit pixels, each having a photoelectric transducer to convert light signals into electric signals, are two-dimensionally arranged;
a microlens to focus a light beam, the microlens being arranged in each unit pixel corresponding to the photoelectric transducer;
an aperture section, to allow the light beam to enter the photoelectric transducer, the aperture section being arranged in each unit pixel corresponding to the photoelectric transducer;
a wiring layer, which comprises plural layers, and is formed between the photoelectric transducer and the microlens,
wherein the plural unit pixels are arranged such that each of the photoelectric transducer is located axisymmetrically with a symmetrical axis of a first centerline passing through an approximate center of the light receiving surface.

2. The solid-state imaging device of claim 1, wherein the plural unit pixels are arranged such that each of the photoelectric transducer is located axisymmetrically with a symmetrical axis of a second centerline passing through an appropriate center of the light receiving surface, the second centerline being vertical to the first centerline.

3. A solid-state imaging device comprising:
a light receiving surface, in which plural unit pixels, each having a photoelectric transducer to convert light signals into electric signals, are two-dimensionally arranged;
a microlens to focus a light beam, the microlens being arranged in each unit pixel corresponding to the photoelectric transducer;
an aperture section, to allow the light beam to enter the photoelectric transducer, the aperture section being arranged in each unit pixel corresponding to the photoelectric transducer;
a wiring layer, which comprises plural layers, and is formed between the photoelectric transducer and the microlens,
wherein the plural unit pixels are arranged such that each of the photoelectric transducer is located in rotation symmetry with a rotation center at an approximate center of the light receiving surface.

4. The solid-state imaging device of claim 3, wherein the plural unit pixels are arranged such that each of the photoelectric transducer is located in one of 90° rotation symmetry and 1800 rotation symmetry with a rotation center at an appropriate center of the light receiving surface.

5. The solid-state imaging device of claim 1, wherein the plural unit pixels are arranged such that each of the aperture section and each of the wiring layer comprising the plural layers are respectively located axisymmetrically with a symmetrical axis of the first centerline passing through an approximate center of the light receiving surface.

6. The solid-state imaging device of claim 2, wherein the plural unit pixels are arranged such that each of the aperture section and each of the wiring layer comprising the plural layers are respectively located axisymmetrically with a symmetrical axis of the second centerline passing through an approximate center of the light receiving surface, the second center line being vertical to the first center line.

7. The solid-state imaging device of claim 3, wherein the plural unit pixels are arranged such that each of the aperture section and each of the wiring layer comprising the plural layers are respectively located in rotation symmetry with a rotation center at an approximate center of the light receiving surface.

8. The solid-state imaging device of claim 4, wherein the plural unit pixels are arranged such that each of the aperture section and each of the wiring layer comprising the plural layers are respectively located in one of 90° rotation symmetry and 180° rotation symmetry with a rotation center at an appropriate center of the light receiving surface.

9. The solid-state imaging device described in claim 1, wherein a configuration and a located position, in the unit pixel, of the photoelectric transducer are respectively arranged axisymmetrically with a symmetrical axis of a third centerline passing through an approximate center of the unit pixel.

10. The solid-state imaging device described in claim 1, wherein in each unit pixel, the photoelectric transducer is arranged such that along with the unit pixel approaching a periphery apart from the approximate center of the light receiving surface, the photoelectric transducer is gradually shifted toward the periphery of the light receiving surface.

11. The solid-state imaging device described in claim 1, wherein a position of the microlens with respect to a position of the photoelectric transducer, in the unit pixel, is shifted such that the microlens is arranged nearer the appropriate center of the light receiving surface than the photoelectric transducer.

12. The solid-state imaging device of claim 10, wherein in each unit pixel, the microlens is arranged such that along with the unit pixel approaching the periphery apart from the approximate center of the light receiving surface, the microlens is gradually shifted toward the periphery of the light receiving surface.

13. The solid-state imaging device of claim 10, wherein in each unit pixel, along with the unit pixel approaching the periphery apart from the approximate center of the light receiving surface, relative positions between the plural layers of the wiring layer are gradually changed.

14. The solid-state imaging device of claim 10, wherein in each unit pixel, along with the unit pixel approaching the periphery apart from the approximate center of the light receiving surface, relative positions between the wiring layer comprising plural layers and the photoelectric transducer are gradually changed.

* * * * *